US 6,530,342 B1

(12) United States Patent  (10) Patent No.: US 6,530,342 B1
Johnson                     (45) Date of Patent:    Mar. 11, 2003

(54) LARGE AREA PLASMA SOURCE (75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/869,245
(22) PCT Filed: Dec. 10, 1999
(86) PCT No.: PCT/US99/27928
    § 371 (c)(1),
    (2), (4) Date: Jun. 27, 2001
(87) PCT Pub. No.: WO00/40771
    PCT Pub. Date: Jul. 13, 2000

Related U.S. Application Data
(60) Provisional application No. 60/114,454, filed on Dec. 30, 1998.

(51) Int. Cl.$^7$ ................................................. H05H 1/00
(52) U.S. Cl. ............................ 118/723 I; 118/723 R; 118/723 E; 156/345.48
(58) Field of Search ................ 118/723 I, 723 R, 118/723 E; 156/345.43, 345.48

(56) References Cited

U.S. PATENT DOCUMENTS

| | | | |
|---|---|---|---|
| 4,277,939 A | 7/1981 | Hyman, Jr. et al. | |
| 5,051,659 A | 9/1991 | Uhm et al. | |
| 5,685,941 A | 11/1997 | Forster et al. | |
| 5,874,014 A | * 2/1999 | Robson et al. | ........... 118/723 E |
| 5,883,016 A | 3/1999 | Chan et al. | |

* cited by examiner

Primary Examiner—Thi Dang
(74) Attorney, Agent, or Firm—Pillsbury Winthrop LLP (57) ABSTRACT A chamber housing (2) enclosing a plasma region (20) in a large area plasma source used for performing plasma assisted processes in large area substrates, the chamber housing (2) being composed of: a housing member (2) constituting a substantially vertically extending wall (4) surrounding a space (6) corresponding to the plasma region (10), the housing member (2) having a plurality of openings (32) and electrically conducive elements forming an electrostatic shield around the space; a plurality of dielectric members (36) each having a peripheral edge and each disposed to close a respective opening (23); and sealing members (40, 40', 42, 42') forming a hermetic seal between said housing member and said peripheral edge of each of said dielectric members (36).

17 Claims, 11 Drawing Sheets

LARGE AREA PLASMA SOURCE

This application is the National Phase of International Application PCT/US99/27928 filed Dec. 10, 1999 which designated the U.S. and that International Application was published under PCT Article 21(2) in English. This application also claims priority from U.S. provisional application No. 60/114,454 filed on Dec. 30, 1998.

BACKGROUND OF THE INVENTION

The present invention relates to plasma sources for use in the performance of plasma-assisted processes, including deposition and etching processes performed on substrates in processing chambers. The invention particularly relates to plasma sources which allow processing of large area substrates.

There is a demand for plasma sources that will enable processes of the above-mentioned type to be performed on large size wafers and even more so for flat panel display processing. There are indications in the industry that efforts will be made to manufacture flat panel displays measuring 1 meter on a side and plasma-assisted processing of such substrates will require higher plasma ion density levels than are produced in existing systems. Plasma-assisted processing of such large area substrates requires both high plasma density and high pumping speed to achieve high processing rates.

In plasma sources of the type described above, the plasma deposition or etching rate will depend on the ion flux, or ion density, as long as the process gas throughput, or pumping speed, satisfies the processing chamber requirements. Therefore, the achievement of satisfactory processing rates for large area substrates requires both the gas throughput and the ion flux be sufficiently high.

In addition, a plasma source having the requisite large dimensions must withstand a considerable force from atmospheric pressure and must be capable of providing an optimum geometry for creation of an electric field that will provide a uniform plasma inside the processing chamber of the source.

BRIEF SUMMARY OF THE INVENTION

It is an object of the present invention to provide a large area plasma source which has the above-mentioned capabilities.

Another object of the invention is to provide a large area plasma source housing capable of supporting atmospheric pressure forces while providing a requisite electrostatic shield for the plasma confined within the housing and permitting transmission of RF electromagnetic field energy to the plasma.

The invention achieves these and other objects by providing a plasma source housing having side walls made of: metal electrostatic shield members that provide support against atmospheric pressure; or a ridged dielectric wall that is capable of supporting atmospheric pressure and is combined with electrically conductive elements that provide the electrostatic shield function; or a combination of the two. These walls can be shaped according to any vertical geometry including, but not limited to, straight, tapering in or out, curved in or out, etc. Therefore, a plasma source housing can be constructed to have virtually any dimensions and shape needed, while allowing RF energy to be supplied to the plasma through the housing wall. In addition, this housing will readily accommodate a system for cooling the processing chamber walls.

A further object of the invention is to achieve a high degree of plasma uniformity within the processing chamber. Because the RF electric field which creates and maintains the plasma originates in the region which surrounds the processing chamber, plasma uniformity is attained by diffusion, with gas species, or processing gas, flow and plasma gradient combining to provide process uniformity. Therefore, at any pressure and RF power level, plasma uniformity is a function of the aspect ratio of the processing chamber, i.e., the ratio of the square root of the cross sectional area to the height of the processing chamber. The cross-sectional area is the area of a horizontal plane at a location where the chamber has an average cross-sectional area.

It presently appears that by applying the principles to be disclosed herein together with standard testing procedures, a high degree of plasma uniformity can be achieved.

The above and other objects are achieved, according to the present invention, by a chamber housing enclosing a plasma region in a large area plasma source used for performing plasma assisted processes on large area substrates, the chamber housing comprising:

a housing member constituting a substantially vertically extending wall surrounding a space corresponding to the plasma region, the housing member having a plurality of openings, and electrically conductive elements forming an electrostatic shield around the space;

a plurality of dielectric members each having a peripheral edge and each disposed to close a respective opening; and sealing means forming a hermetic seal between the housing member and the peripheral edge of each of the dielectric members.

DETAILED DESCRIPTION OF THE INVENTION

Figure 1:
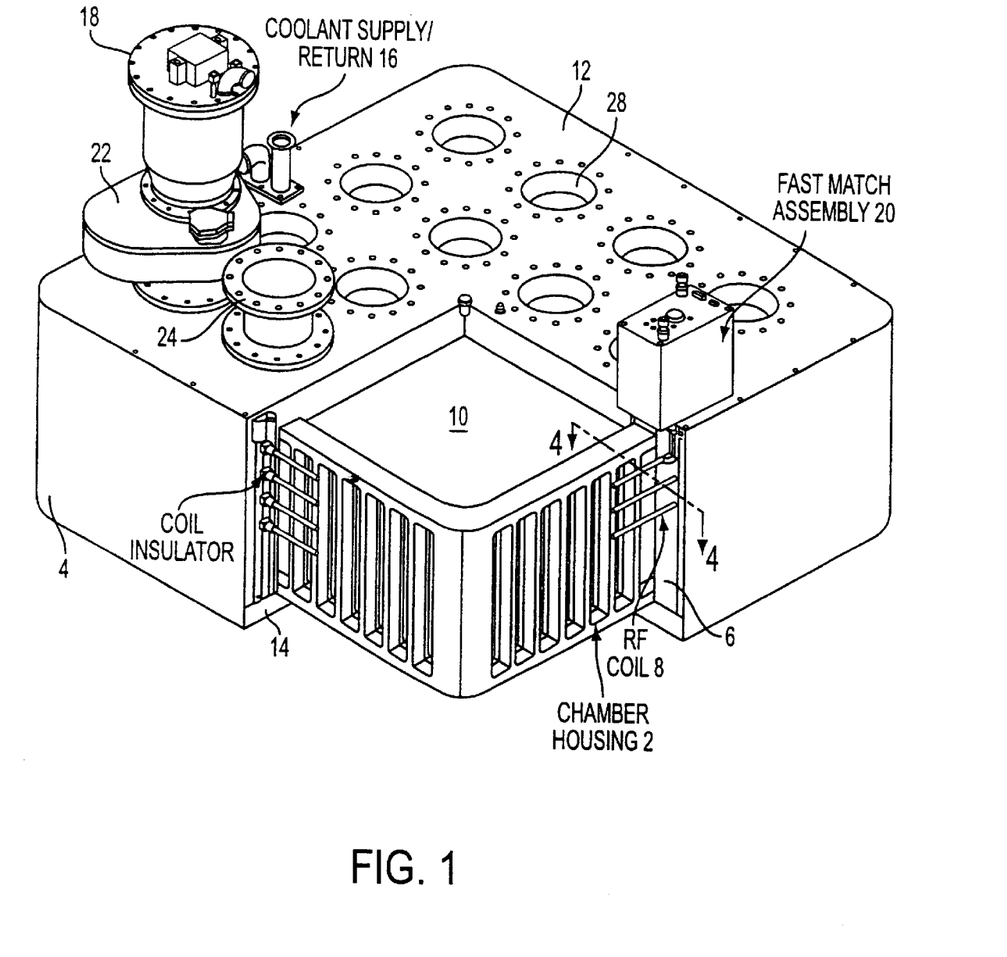
FIG. 1 is a perspective view of a first embodiment of a large area plasma source according the present invention.

FIG. 1 illustrates a first embodiment of a processing apparatus according to the invention. This apparatus is composed essentially of a chamber housing 2 and an enclosure 4 which surrounds housing 2. Housing 2 and enclosure 4 cooperate to delimit an annular space 6 which, in this embodiment, has a rectangular cross-section in a horizontal plane. This is an appropriate shape for processing substrates constituting flat panel displays. However, other cross sections can be provided and, for some applications, e.g., semiconductor wafer processing, a circular cross section will not only correspond to the substrate shape but also provides better structural integrity than a rectangular shape.

Space 6 is filled with a liquid coolant and contains an RF coil 8 that is supplied with an RF current which generates an electric field in the region enclosed by housing 2 in order to ignite and sustain a plasma in processing region 10 enclosed by housing 2 and by upper and lower walls of enclosure 4. Upper wall 12 of enclosure 4 carries coolant supply and return lines 16, vacuum pump assemblies 18 for pumping gas molecules and ions out of processing region 10 and maintaining a desired vacuum pressure therein, and passages (not shown) for couplings used to introduce fresh processing gas into region 10.

Wall 12 additionally carries a fast match assembly, or match network, 20, which is a component that is known per se and that is typically made up of an L-network of two variable capacitors and an inductor wherein the variable capacitors are mechanically adjusted by an automatic control network. The purpose of network 20 is to equilibrate the source impedance of the RF generator with the load impedance as seen by the generator looking into the match network and plasma source. Typically, the source impedance of the RF generator is 50Ω and, hence, the variable match network components are varied such that the output impedance of the match network is the complex conjugate of the input impedance to the plasma source. During matched conditions, the forward power at the match network juncture is maximized and the reflected power is minimized. Match network designs, although different in speed, robustness and controllability, are all based upon the same fundamental principles and are often found described in the prior art.

As will be described in greater detail below, chamber housing 2 provides the vertical bounding walls for region 10 and is constructed to withstand the forces acting on walls 12 and 14 due to the difference between the atmospheric pressure acting on the outer surfaces of the relatively large area walls 12 and 14 of enclosure 4 and the vacuum pressure established in region 10 and acting on the inner surfaces of those walls. Chamber housing 2 is further constructed to provide an electrostatic shield for region 10 and allow transmission of RF energy from coil 8 to region 10. The vertical wall of enclosure 4 may, but need not, be constructed to assist in withstanding the above-mentioned forces imposed on walls 12 and 14 by the pressure differentials between opposed surfaces of each wall.

Each vacuum pump 18 is part of a vacuum pump assembly that includes a respective gate valve or throttle, 22 mounted on wall 12 with the aid of a coupling flange 24. When gate valve 22 is left wide open, maximum pumping speed can be achieved. However, partial closure can permit a spatial variation of the pumping speed by means of varied flow restriction through the distributed pumping orifice. Gate valve 24 can be of a known design.

Flange 24 is a cylindrical part which provides a flow path between a respective through bore 28 in wall 12 and the inlet end of a respective pump 18. Bores 28 are pumping ports which will each communicate with the inlet of a respective vacuum pump 18. By suitable positioning, and selection of the number, of bores 28, along with suitable selection and control of the operation of pumps 18, the exhaust gas flow can be tuned for uniform gas exit from the region 10. Selection and control of pumps and the arrangement of bores 28 can be effected on the basis of principles and practices already well known in the art.

Attainment of the desired process uniformity also requires appropriate control of gas injection. This aspect of the invention will be described, infra.

In addition, the bottom of the source will be provided with a suitable substrate support and means for applying a bias voltage, for example, an RF bias to the support. Here again, such a substrate support can be constructed and installed in the source in accordance with principles and practices already well known in the art.

Figure 2:
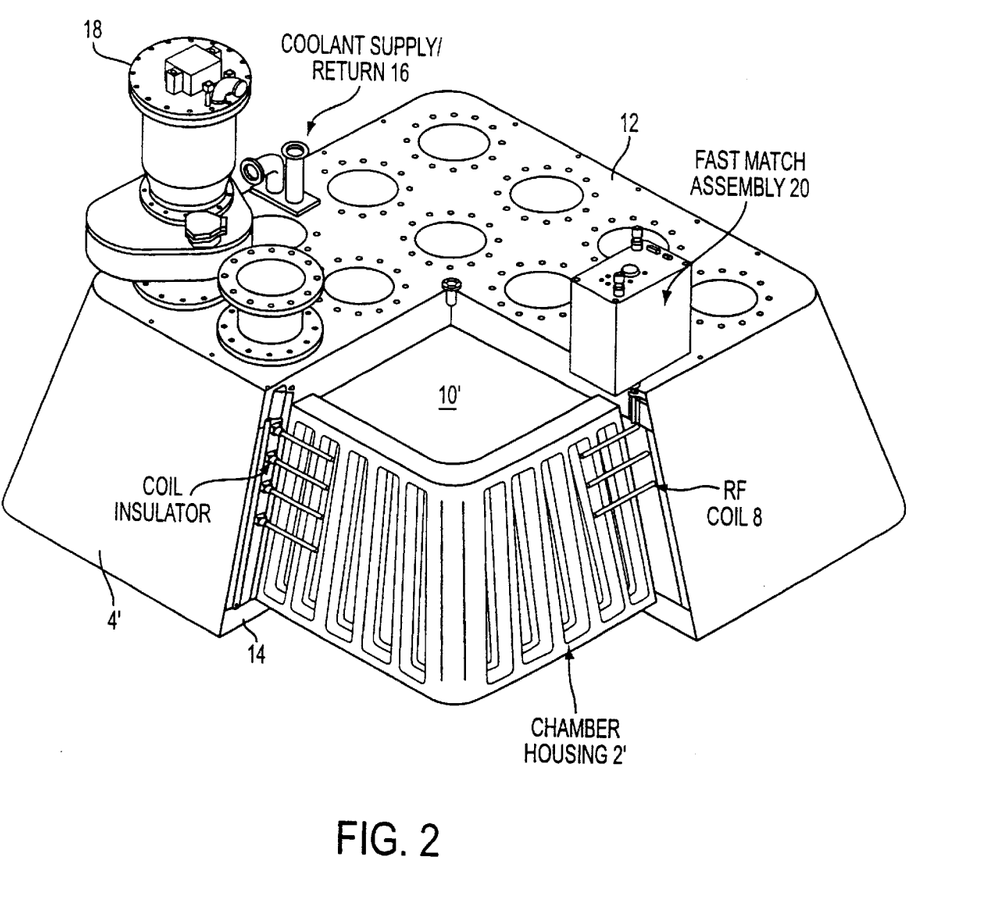
FIG. 2 is a view similar to that of FIG. 1 showing a second embodiment of the plasma source according to the invention.

FIG. 2 is a view similar to that of FIG. 1 showing a second embodiment of a source according to the invention which differs from the source in FIG. 1 essentially with respect to geometric configuration. Whereas chamber 10 of the embodiment shown in FIG. 1 has the form of a parallellapiped, chamber 10' of FIG. 2 has the form of a pyramidal frustum. Thus, the side walls of housing 2' are inclined with respect to a vertical axis of the source as are the side walls of enclosure 4'.

Figure 3:
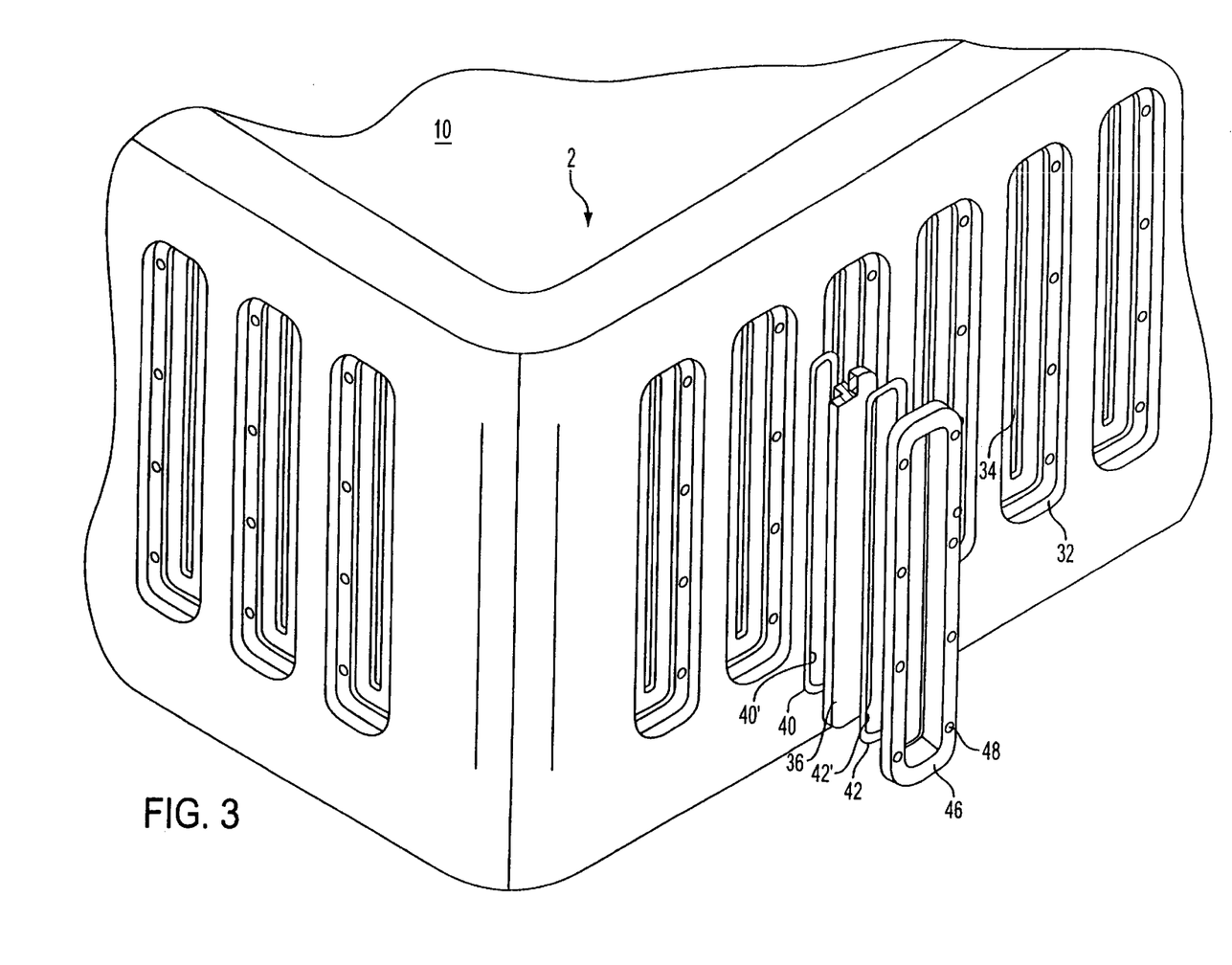
FIG. 3 is a perspective, detailed view of a portion of one component of the embodiment shown in FIG. 1, with several elements shown in exploded form.

FIG. 3 is a perspective, detail view showing a portion of housing 2, which is made of a conductive material, such as aluminum, and is given a wall thickness sufficient to provide the requisite compressive and tensile strengths. When the interior of enclosure 4 is under a vacuum, integrated pressure forces directed toward the interior thereof will generate a bending moment within the material, hence creating separate regions of enclosure 4 that are under tension or compression.

Being made of a conductive material, housing 2 constitutes an electrostatic shield. Housing 2 is provided with a series of vertically elongated recesses 32 that are spaced at uniform intervals about the housing periphery. At the center of each recess 32, there is a narrow, elongated slot 34 which extends through the remaining thickness of housing 2 to communicate with region 10. Each recess 32 is provided with an insert 36 made of a dielectric material, such as alumina, with a projecting portion that extends into slot 34 of its respective recess 32. Each insert 36 is provided with four elastomeric vacuum seals 40 and 40' at the inwardly facing surface of insert 36 and 42 and 42' at the outside of insert 36. Each insert 36 is covered by a respective frame 46 which holds its associated insert 36 and seals 40, 42 in place in recess 32, with the aid of a plurality of screws (not shown) that extend through screw holes 48. Between the two seals 40 and 40' there is provided at least one passage to atmosphere, shown at 52 in FIG. 4. This passage is fabricated to extend to a location outside of enclosure 4 for access when the system is totally assembled. Passage 52 allows for leak checking both seals 40 and 40'. Thus, both sealing with respect to the coolant fluid 54 between chamber 2 and wall 4 and sealing with respect to the vacuum in region 10 can be checked with one port.

RF energy can flow from coil 8 into region 10 through inserts 36 and slots 34.

Figure 5:
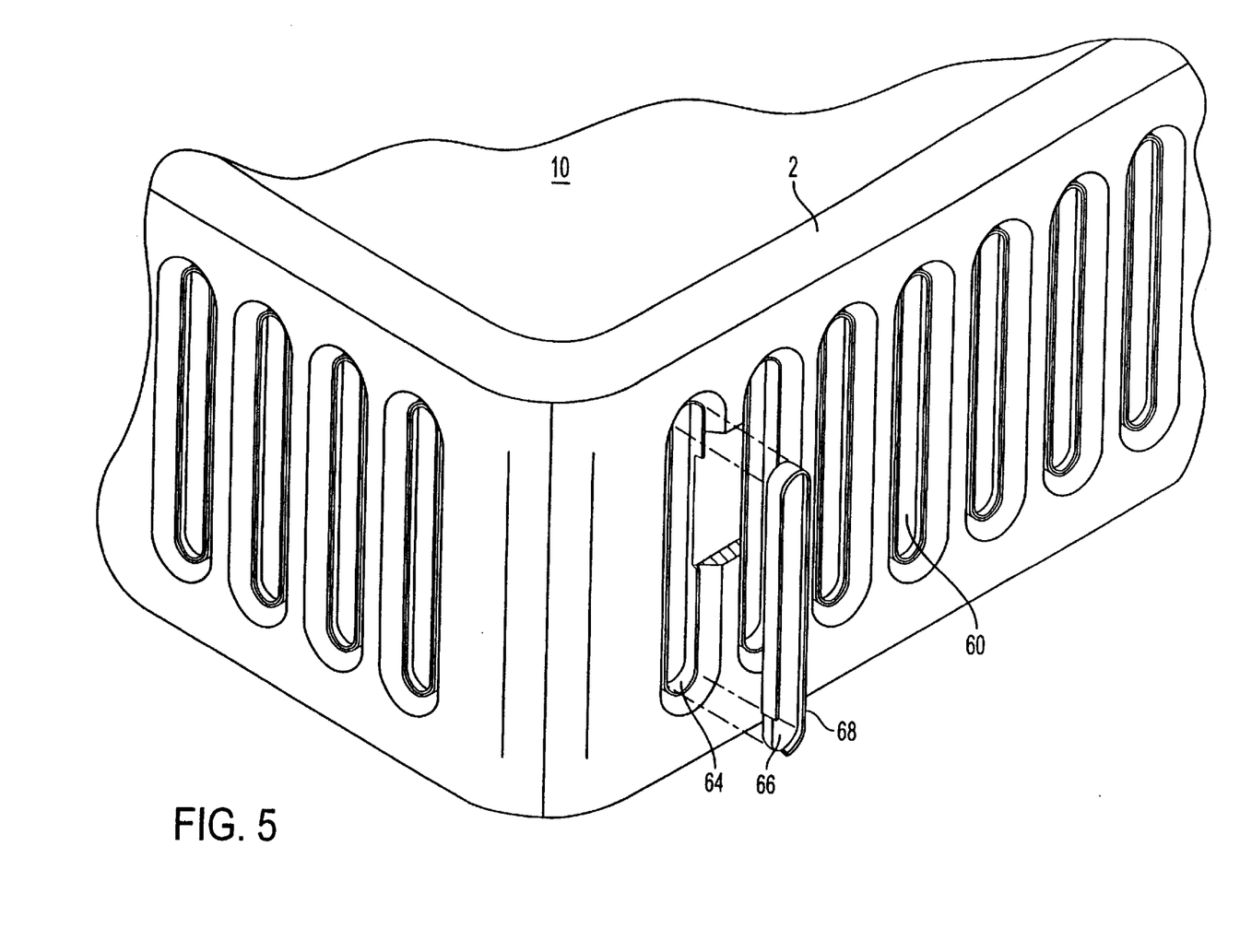
FIG. 5 is a view similar to that of FIG. 3, showing a second embodiment of the component of the source shown in FIG. 1.

FIG. 5 shows another form of construction of the embodiment of FIG. 1. In the form of construction shown in FIG. 5, housing 2 is provided with vertically elongated slots 60 that extend through the entire wall thickness of housing 2. In the illustrated embodiment, each slot 60 has an outwardly diverging, or flaring, portion adjacent the exterior surface of housing 2, and a portion 64 having a surface that is perpendicular to the vertical walls of housing 2. A dielectric window 66 is installed in portion 64 of each slot 60 and is secured to portion 64 by a metal band 68 which is brazed to both portion 64 and the peripheral edge of dielectric window 66. Band 68 serves to compensate for thermal expansion differences between dielectric window 66 and housing 2. FIG. 5 shows a broken-away portion of the outer vertical surface of housing 2. The reason for this portion is to better illustrate the cross-sectional form of the regions between adjacent slots 60.

Band 68 may be made of Kovar™, which is a trade-name for a metal alloy containing 54% iron, 29% nickel and 17% cobalt. The coefficient of thermal expansion for Kovar is between that of the metal housing and dielectric window. The use of such a material is common to the industry.

Figure 4:
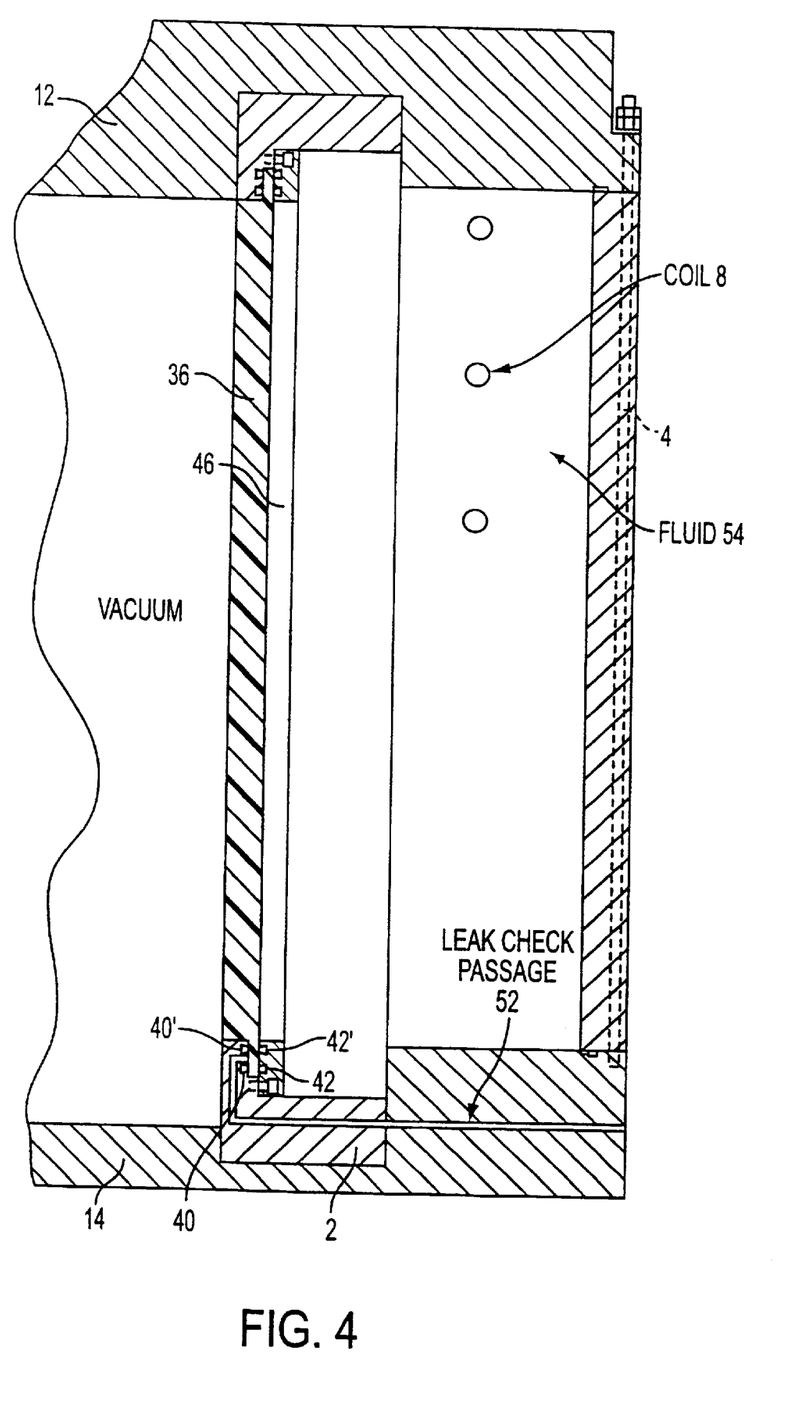
FIG. 4 is a cross-sectional, elevational view taken along line 4—4 of FIG. 1.

In the embodiment of FIG. 5, each slot 60 can be given a larger area than each slot 34 of the embodiment shown in FIGS. 3 and 4, so that the FIG. 5 embodiment is capable of providing a larger total effective dielectric window area for passage of RF energy into region 10. In addition, the structure, or structural area, necessary to fasten the dielectric window to the housing walls of the plasma source is minimized in this embodiment.

Figure 6A:
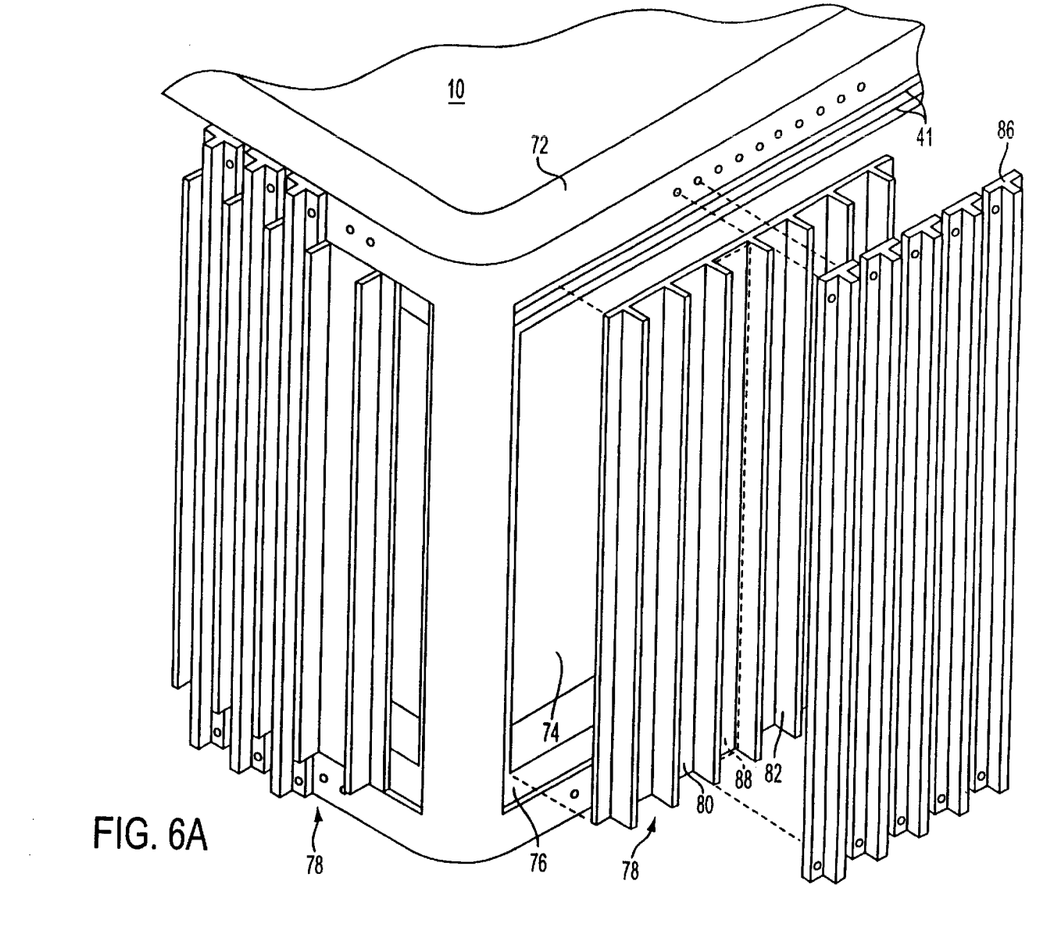
FIG. 6A is a view similar to that of FIG. 3, showing a third embodiment of the component of the source shown in FIG. 1.

FIG. 6A illustrates a further embodiment of a chamber housing 72 according to the invention. Housing 72 has the same general form as housing 2 of FIG. 1, but is provided on each side with a large area opening 74 surrounded by a recessed portion 76 that frames opening 74. Each opening 74 is completely covered by a rigid dielectric panel 78 made, for example, of alumina. Each panel 78 is a one-piece dielectric body composed of a flat base portion 80 and a plurality of vertically extending ribs 82 that project at right angles from base portion 80. Panel 78 is dimensioned to extend entirely across opening 74 and recessed portion 76.

Housing 72 is further provided with a plurality of elongated load supporting members 86 made of electrically conducting material, such as aluminum. Each member 86 has a T-shaped cross section, is seated between two adjacent ribs 82 and is securely connected at its upper and lower ends to top and bottom edges of housing 72. Members 86 function as the conductive members of the electrostatic shield and it is important these members have good RF electrical contact to housing 72 both at the top and bottom. Satisfactory contact, and a sound mechanical connection, can be provided by using machine screws (not shown) to secure the upper and lower ends of each member 86 to the top and bottom edges of housing 72. Because members 86 are made of metal and are therefore relatively inelastic, a layer of an elastic material is preferably disposed between each member 86 and its associated part of base portion 80. One such member 88 is shown in broken lines in FIG. 6A.

Figure 6B:
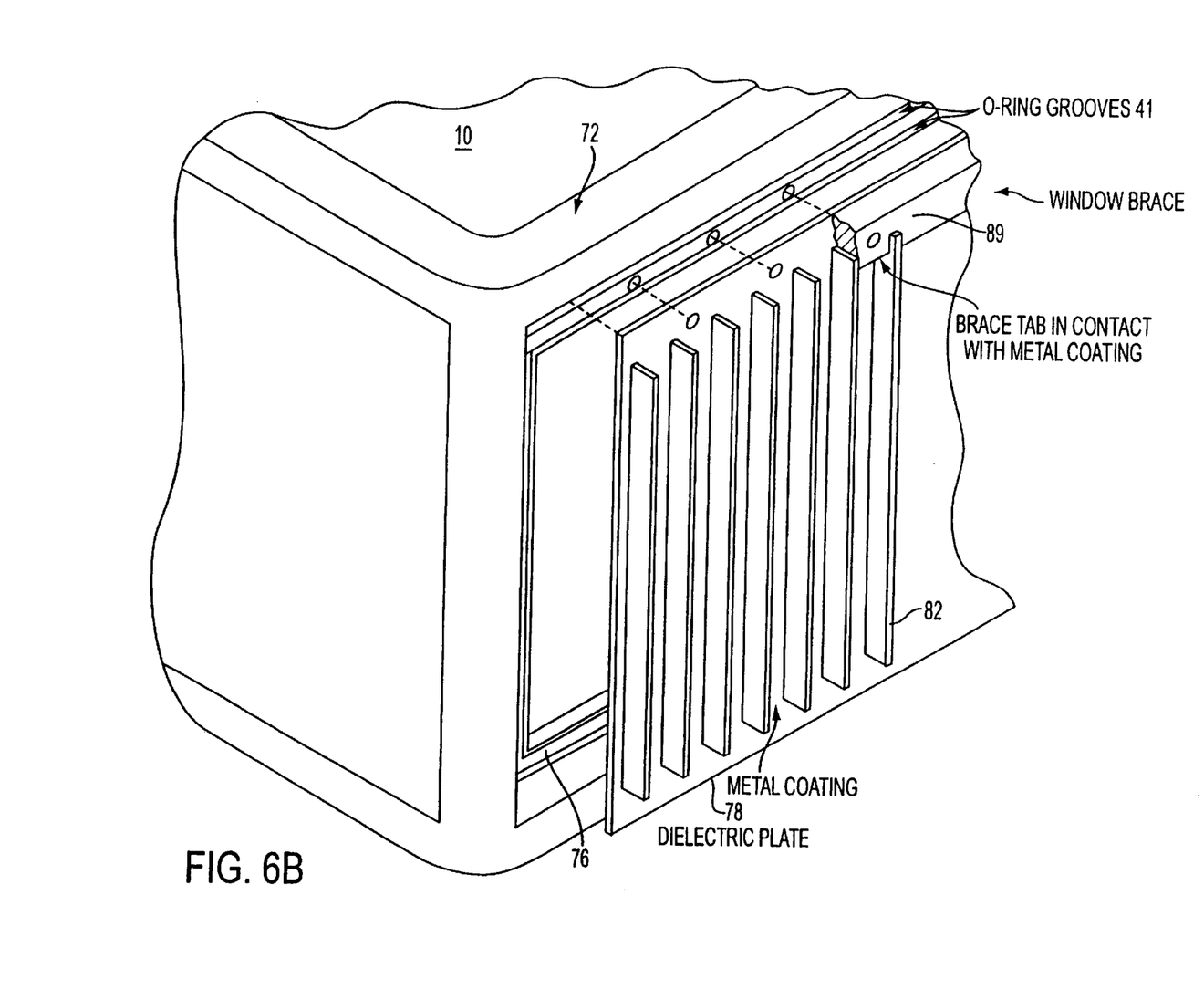
FIG. 6B is a view similar to that of FIG. 6A showing a modified form of the embodiment of FIG. 6A.

As an alternative to the embodiment illustrated in FIG. 6A, the electrostatic shielding may be provided in the form of a metal coating on the external surface of each panel 78, as shown in FIG. 6B. This coating will be in the form of individual strips each located between two adjacent ribs 82. In this embodiment, ribs 82 are shortened so that their ends are spaced from the upper and lower edges of each panel 78. Upper and lower window braces 89 (only upper brace 89 is shown in FIG. 6B) extend along the upper and lower edges of each panel 78, are provided with notches that receive the ends of ribs 82 and with tabs which interlock with the ribs 82. These tabs are in direct contact with the applied metal coating. Window braces 89 secure the entire perimeter of each dielectric panel 78 to the associated opening in housing 72. Braces 89 are bolted to housing 72 as shown in FIG. 6B.

Figure 6C:
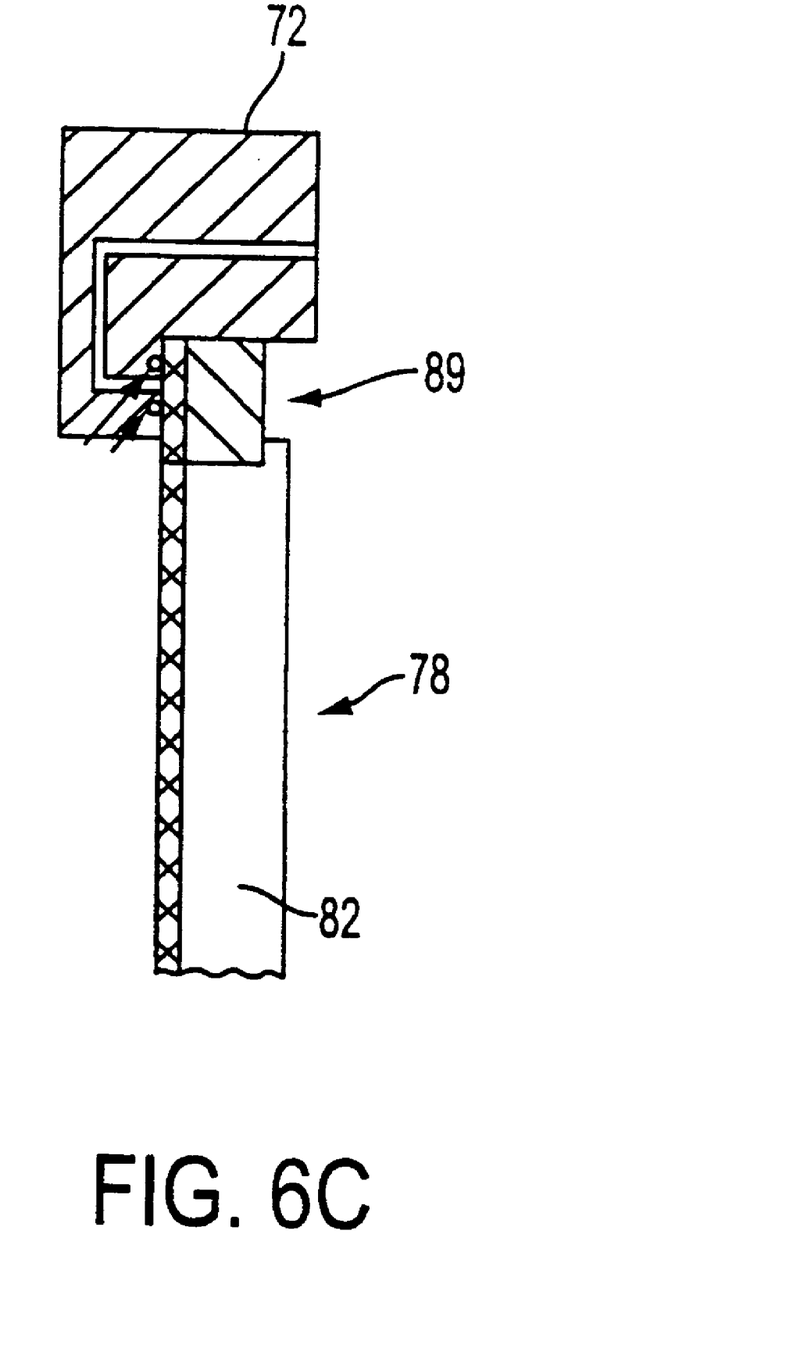
FIG. 6C is a cross-sectional detail view of a portion of the structure shown in FIG. 6B.

Each brace 89 has certain built in features that are shown in FIG. 6C. In particular, FIG. 6C shows O-ring seals 40 and 40" and leak testing port 52'. In both embodiments presented in FIGS. 6A and 6B, each dielectric panel 78 must be capable of withstanding the bending moments imposed due to inwardly directed pressure forces present when a chamber vacuum exists. This the primary purpose of ribs 82.

In the case of the embodiment shown in FIG. 6A and the alternative thereto described above, each dielectric panel 78 is hermetically sealed to its associated recessed portion 76 by at least two O-rings held in grooves 41. Preferably, sealing is achieved by the provision of dual elastomeric seals, like rings 40 and 40', separated by a space which is coupled by a series of passages, like passage 52, internal to the housing to the outside to allow technicians to sense liquid leaks or vacuum leaks.

Figure 7:
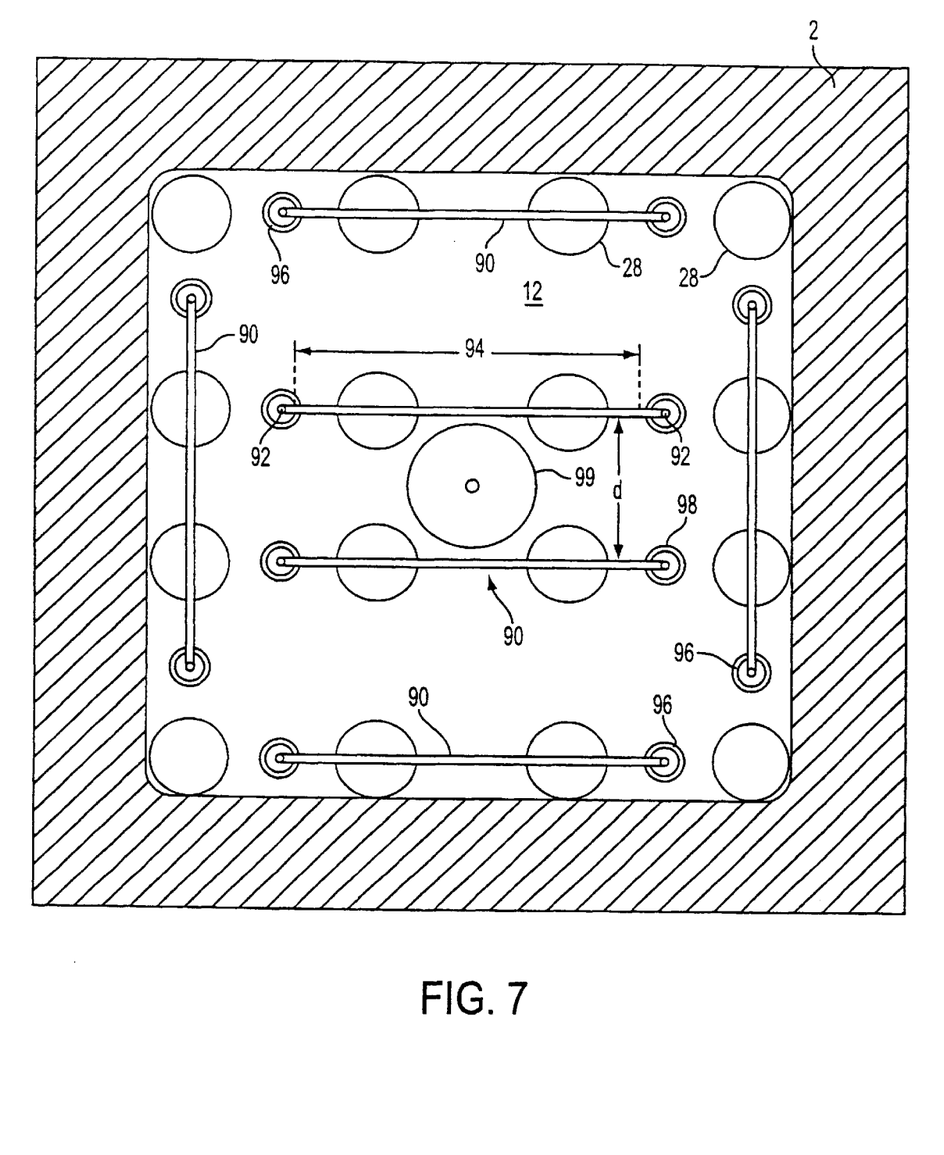
FIG. 7 is a cross-sectional plan view of an embodiment of the source illustrated in FIG. 1, looking upwardly from within the chamber housing.

FIG. 7 is a cross-sectional plan view showing the wall of chamber 2 and the bottom surface of wall 12 when one looks upwardly from within chamber region 10. Wall 12 carries an array of processing gas introduction tubes 90 having vertically extending inlet portions 92 that extend through, and are supported by, dielectric inserts 96 that are secured in openings 98 in wall 12. Inserts 96 and other dielectric parts of this assembly may be made of, for example, PTFE. Each tube 90 has a horizontally extending outlet portion 94 that extends between its associated inlet portions 92. Outlet portion 94 of each tube 90 is provided with a row of outlet holes, or injection nozzles, 94' (FIGS. 8A and 8B) extending along the length thereof.

Outlet portions 94 of tubes 90 can be placed at a height above the substrate to be treated that allows the optimum gas species to arrive at the substrate. As the distance between outlet portions 94 and the substrate is increased, the spacing between tubes 90 can be increased while the density of ionized gas reaching the substrate remains approximately uniform. Of course, an increase in the spacing between tubes 90 results in a reduction in the number of tubes. For certain processes, however, it may be desirable to bring the outlet portions of tubes 90 closer to the substrate. This may be done, for example, if it is desired to reduce the time between gas ionization and contact of the resulting ions with the substrate.

Each gas injection tube input portion is connected to a flow regulating valve or an individual mass flow controller to control the injection of gas from an inlet manifold (not shown). By controlling the flow of gas into each end of each tube 90, a variety of gas injection profiles are made possible, as will be described below.

At the center of wall 12 there is provided a viewport 99 in the form of a funnel-shaped passage. This funnel-shaped passage is angled such that it provides a field of view encompassing the entire substrate being processed. Viewport 99 may be used simply for visual inspection of the chamber and its process, or it may accommodate a diagnostic system requiring optical access to the inner chamber.

The exterior surfaces of gas introduction tubes 90 will become coated with residue of the processing gasses over the course of time. According to a further feature of the invention, these coatings can be removed from tubes 90 by applying RF bias to tubes 90 during cleaning of the interior of housing 2.

Such cleaning is conventionally performed periodically in present day etch or deposition chambers by a separate cleaning process wherein the chamber is cleaned with a substrate installed in region 10. Region 10 is filled with a gas which, when ionized in a plasma, is capable of removing residue coating from surfaces within housing 2 and a plasma generating RF field is created in region 10. In wafer processing, this cleaning process is often conducted at very much higher pressure than the normal process pressure to improve the chemical process rate by increasing the number of atoms, or ions, in the plasma. Applying RF bias to parts of housing 2 can also increase the residue removal rate.

It is also known to install a metal electrode outside the housing and behind the dielectric wall of the housing and to apply a voltage to the electrode in order to provide bias to the wall and increase the cleaning rate. An arrangement of this type is disclosed, for example, in pending provisional application No. 60/065,794, by Wayne Johnson, entitled ALL RF BIASABLE AND/OR SURFACE TEMPERATURE CONTROLLED ESRF.

Application of RF bias to tubes 90 can increase the energy of ion bombardment within tubes 90 and thus increase the rate and effectiveness with which residues are etched away from their interior walls. Ion bombardment can be thought of as increasing the surface temperature of surfaces being bombarded and hence can increase the chemical reaction rates.

Preferably, injection tubes 90 are made of anodized aluminum or are composed of a metal tube component sheathed in dielectric tubing made of quartz or alumina.

To allow for application of a cleaning RF bias voltage to tubes 90, it is necessary to isolate tubes 90 electrically from the walls of enclosure 4. Such isolation is needed so that plasma is not created inside the tubes that deliver gas. This bias will not be applied during normal operation, but only during periodic cleaning cycles. The RF bias to the gas injection tubes is applied periodically to clean the exterior surface (or process side). During etch process, contaminants may build up on the tube surface. To minimize long-term particulate contamination, the exterior surface of the injection tubes (in addition to all surfaces within the chamber) must be cleaned during a cleaning cycle. The RF bias will generate a DC self-bias (and resultant average voltage difference across the sheath) which in-turn affects the average ion energy delivered to the injection tube surface.

If the tubes are made of conductive material, then a capacitor is needed to allow them to charge by self-bias.

In order to prevent the generation of a plasma within the interior volume of the injection tubes during RF bias application, it is possible to use strictures inside the tube that minimize breakdown by use of dielectric surface area. One example is a bundle of capillary tubes of dielectric material (quartz) in the gas flow path as has been used in the semiconductor industry to deliver process gas to an upper electrode-inject plate.

Figure 8A:
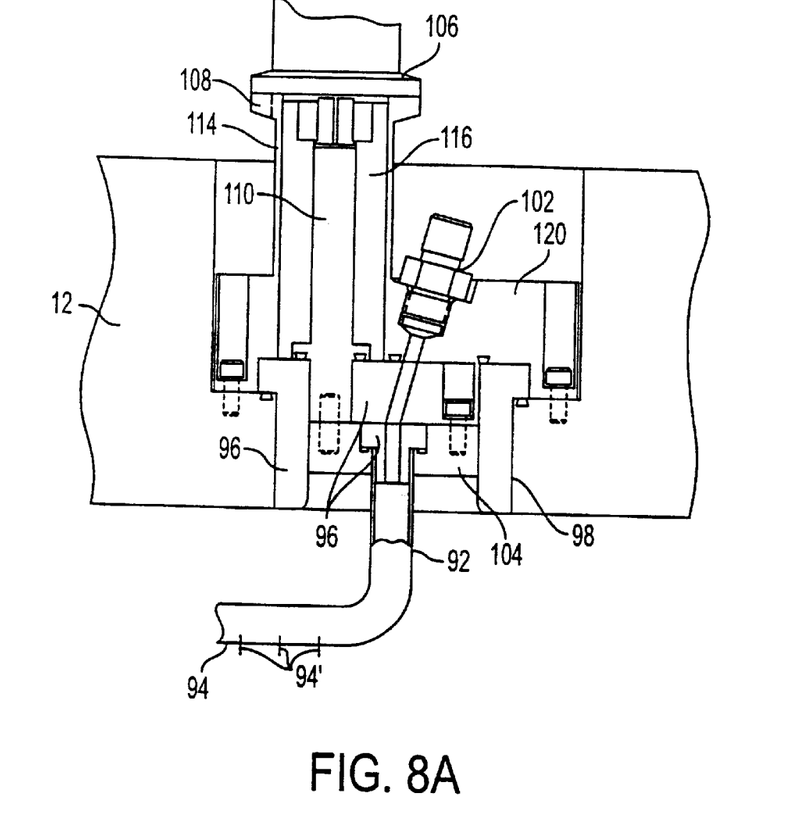
FIGS. 8A and 8B are, respectively, an elevational, cross-sectional detailed view and a bottom plan detailed view of components of the embodiments shown in FIG. 1.
Figure 8B:
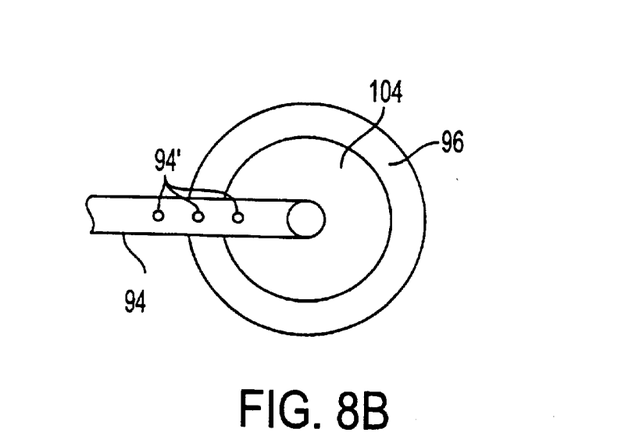

FIGS. 8A and 8B show details of an arrangement for supplying RF voltage to an injection tube 90. FIG. 8A is a cross-sectional view and FIG. 8B is a bottom plan view of the entrance region of one injection tube 90 via which process gas is supplied and RF bias is applied. This assembly resides within upper wall 12. Process gas is fed from a standard gas line and fitted to the gas injection system using a standard fitting 102, as shown. Dielectric inserts 96 isolate fitting 102 from a conductive base ring 104 which surrounds inlet portion 92. A RF voltage is applied to ring 104 through a standard connection flange made at the output of the respective match network, an RF connection interface 108 and a RF inner conductor 110 which forms a unit with base ring 104. The RF feed input to the gas injection RF bias assembly is a standard feed consisting of inner conductor 110, an outer conductor 114 and a dielectric 116 sandwiched between the conductors. Inner conductor 110 attaches to base ring 104 that is in immediate contact with gas injection tube 90. Outer conductor 114 is integral with a support plate 120. Dielectric inserts 96 and 116 isolate outer conductor 114 and its support plate 120 from inner conductor 110 and ring 104.

According to the invention, the distribution of processing gas within region 10, using the injection tube arrangement shown in FIG. 7, can be controlled by suitable selection of one or more of gas inlet pressure, gas flow rate and the total area of the injection nozzles (94') in each tube 90. The relationships involved in effecting this control will be described with reference to FIGS. 7, 9, 10A and 10B.

As shown in FIG. 7, processing gas enters region 10 via the array of injection tubes 90 whose outlet portions 94 lie in a common horizontal plane located at a selected vertical distance below enclosure wall 12, which wall constitutes a pump manifold plate. However, it is not necessary that all injection tubes 90 lie in a common horizontal plane. In fact, it may be beneficial to vary their vertical spacing relative to the wafer plane.

Figure 9:
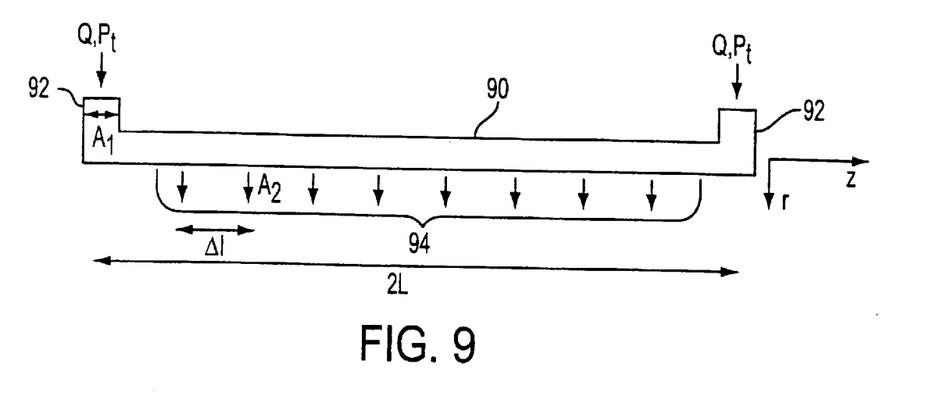
FIG. 9 is an elevational, pictorial view illustrating the principle of operation of a component illustrated in FIG. 7.

Injection tubes 90 are equally spaced (with spacing d) in one horizontal direction. As illustrated in FIG. 9, outlet portion 94 of each tube 90 has a length 2 L in a horizontal direction across region 10. As noted earlier herein, the number of tubes 90, and their spacing, d, can be varied to achieve a selected processing result. Equally, length 2 L is selected on the basis of the desired processing result. Each injection tube 90 has a cross-sectional area $A_1$ along its entire length, i.e., along its inlet and outlet portions, and outlet portion 94 of each tube 90 is provided with N injection nozzles (94' in FIGS. 8A and 8B) each having a cross-sectional area $A_2$. Thus, the injection nozzles in one tube 90 have a total outlet area $A_{2T}=NA_2$. The injection nozzles are uniformly spaced apart with a spacing $\Delta l$ between the center lines of adjacent injection nozzles. Gas is fed to both ends of a tube 90 with an inlet pressure $P_t$ and a volume flow rate Q at each end, i.e., at each inlet portion. This is also elaborated in the discussion of FIG. 9. The cross-sectional area of each tube 90 need not be constant nor do the injection nozzles need to be equally spaced. Clustering of the injection nozzles may be beneficial for additional gas injection control.

The injection system is designed to introduce the processing gas to a large volume chamber region 10 in which a vacuum pressure $P_c$ is maintained. The gas is introduced at subsonic speeds, i.e., $M=v/a<0.3–0.5$ where M is the Mach number, v is the gas velocity at each exit orifice and a is the local speed of sound.

According to the invention, the distribution, or gradient, of gas exit velocities across the length of output portion 94 of a tube 90 can be controlled by proper selection of the flow rate Q and the inlet total pressure $P_t$ at both ends of that tube 90. The particular gradient established will influence the uniformity of the plasma-assisted treatment across the substrate surface.

When the flow rate Q into an injection tube 90 is high, an exit velocity distribution can be obtained such that the velocity is greatest at the mid-point of the length of the outlet portion of the tube and decreases progressively toward the ends thereof. Alternatively, when the flow rate Q is low, the velocity distribution is such that the greatest velocities are achieved at the ends of tube outlet portion 94. Hence, it is possible to control the velocity distribution along the length of the outlet portion of a tube 90, or the span-wise velocity distribution, by adjusting the inlet volume flow rate Q.

For the sake of clarity, the terms "high flow rate" and "low flow rate" will be defined. A "high flow rate" is one in which the gas momentum is large relative to the difference in pressure between the gas in the injection tube and the chamber pressure. Similarly, a "low flow rate" is one in which the relative gas momentum is small. In the case of a high flow rate, the lateral pressure gradient is unable to sufficiently bend the "high" momentum fluid and accelerate it through the adjacent injection nozzle; therefore, the predominant mechanism is deceleration of the gas to a stagnation pressure at the midpoint of the length of the outlet portion 94 of the tube 90 where momentum is cancelled and a sufficient pressure difference can be achieved. The stagnation flow at the outlet portion midpoint is simply a consequence of introducing process gas at both ends of the injection tube. In the case of a low flow rate, the gas momentum is such that gas will tend to exit via openings at the ends of the outlet portion of the injection tube under the effect of the differential between the inlet pressure and the pressure in chamber region 10; as gas exits through successive injection nozzles 94', the pressure within outlet portion 94 of a tube 90 decreases.

Taking a more rigorous approach, the above explanation can be substantiated in a clearer manner. Consider the transverse equation of momentum for the coordinate system indicated in FIG. 9. Assuming the flow to be steady and two-dimensional and neglecting the viscous terms, the transverse equation of momentum becomes:

$$\frac{-1}{\rho}\frac{\partial P}{\partial r} = v_z \frac{\partial v_r}{\partial z} + \frac{\partial v_r}{v_r \partial r} \tag{1}$$

The radial pressure gradient is balanced by two terms; the first of which represents the transfer of stream-wise momentum (in the direction z) into radial momentum (in the direction r), and the second of which represents the radial acceleration of the radial flow. The injection tube design depends on an independent set of parameters including $\rho_0$, Q, $P_t$, $P_c$, $A_1$, $A_{2t}$, $\Delta l$ and L; refer to FIG. 9. Note that this parameter list excludes the number N of injection nozzles 94' and their respective cross-sectional areas $A_2$ since N=2 L/$\Delta l$ and $A_2$=$A_{2T}$/N). Neglecting compressibility effects (a good assumption for M<0.3), the radial equation of momentum is non-dimensionalized using the following relationships $$z^* = \frac{z}{\Delta l} \tag{2a}$$

$$r^* = \frac{A_{2T}r}{2A_1 \Delta l} \tag{2b}$$

$$v_z^* = \frac{A_1 v_z}{Q} \tag{2c}$$

$$v_r^* = \frac{A_{2T} v_r}{2Q} \tag{2d}$$

-continued $$P^* = \frac{P}{\Delta P} \tag{2e}$$

$$\rho^* = \frac{\rho}{\rho_0} \tag{2f}$$

where $\Delta P$=$P_t$-$P_c$; $\rho$ represents local density, and $\rho_0$ represents density at stagnation conditions. The radial length and velocity scales are obtained by virtue of continuity. Hence, the non dimensional radial equation of momentum is obtained, $$\frac{\partial P^*}{\rho^* \partial r^*} = B^* \left( v_z^* \frac{\partial v_r^*}{\partial z^*} + v_r^* \frac{\partial v_r^*}{\partial r^*} \right) \tag{3}$$

which identifies the non-dimensional parameter $$B^* = \frac{4\rho_0 Q^2}{A_{2T}^2 \Delta P} \tag{4}$$

Figure 10A:
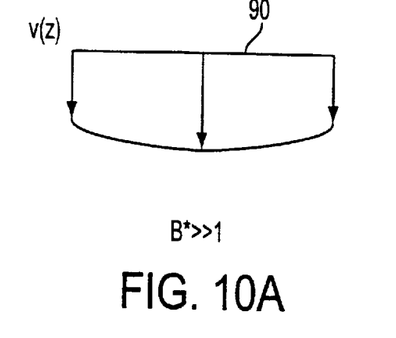
FIGS. 10A and 10B are velocity distribution diagrams illustrating different modes of operation of the components shown in FIG. 9.
Figure 10B:
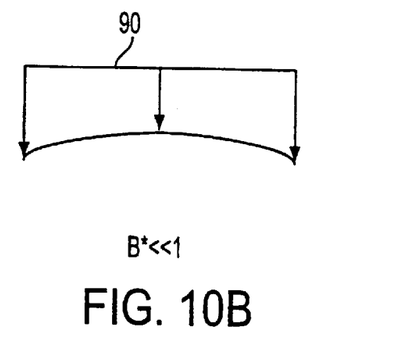

When $B^* \gg 1$, this corresponds to high flow rates at which the pressure gradient is inadequate to substantially turn the stream-wise momentum and, hence, larger velocities exit at the midpoint, or center, of the outlet portion of the injection tube. Conversely, $B^* \ll 1$ corresponds to low flow rates at which the opposite is true. The resulting velocity distributions are depicted in FIGS. 10A and 10B.

Thus, if $B^*$=1, the gas exit velocity will be constant along the length of outlet portion 94 of tube 90. For many processes, this will be the preferred exit velocity distribution. However, there may be situations in which it is preferable that $B^* \ne 1$. For example, the RF field generated in region 10 may vary in intensity in radial directions perpendicular to the vertical center axis of region 10. In such a case, a gas flow rate variation having a form shown in one of FIGS. 10A and 10B may be used to compensate for the RF field variation in order to produce a processing result which is uniform across the surface of the substrate.

Close inspection of the definition of $B^*$ provides insight into the design of injection tubes 90. For example, the condition $B^* \gg 1$ can be achieved by performing any one of the following actions while holding all other parameters constant: increase Q (increase the gas momentum $\rho_0 V$); decrease $\Delta P$ (reduce the turning force); and decrease $A_{2T}$ (provide greater flow resistance).

Typically, a fixed relation will exist between a given value for $P_c$, inlet pressure and flow rate. However, it might be possible to independently control the inlet total pressure and the mass flow rate. This would require adjusting the total pressure losses in the system using throttle valves. For example, the throttle valve upstream of the turbo-molecular pump can adjust the chamber pressure and pressure regulators upstream of the injection tubes can regulate the total pressure.

Considering the list of independent dimensional parameters listed previously, it is sufficient to define a parameter for uniformity u=P(z=0)−P(z=L) such that the non-dimensional uniformity u*=u/$\Delta P$ takes the form $$u^* = u^* \left( B^*, \frac{\Delta l}{L}, \frac{\Delta P}{P_c}, \frac{A_2}{A_1}, \frac{A_1}{L^2} \right) \tag{5}$$

We consider the asymptotic limit where the four latter parameters go to zero, i.e., the number of injection nozzles is large ($\Delta l/L \rightarrow 0$), the pressure difference is small relative to the absolute value ($\Delta P/P_c \rightarrow 0$), each injection nozzle area $A_2$ is small relative to the injection tube cross-sectional area ($A_2/A_1 \rightarrow 0$), and the injection tube is long relative to its diameter ($A_1/L^2 \rightarrow 0$). Nominal conditions for $B^* \sim 1$ are: $\Delta l=1.0$ cm, $L=50$ cm, $N=100$, $A_1=1.77$ cm$^2$, $A_2=0.0079$ cm$^2$, $P_c=500$ mTorr, $P_t=600$ mTorr and $Q=160$ sccm (or $Q_{tot}=320$ sccm).

According to various alternatives made possible by the invention, it may be desirable to allow the gas flow to choke at the gas injection nozzles 94'. When the pressure ratio across an injection nozzles 94' (i.e., the ratio of the total pressure inside the injection tube to the ambient chamber pressure beyond the exit of the injection nozzle) is sufficiently large, the injection nozzle reaches a "choked" condition wherein the volume flow rate is invariant with either further reduction of the back pressure (or chamber pressure) or increase of the inlet total pressure. In fact, the mass flow can only be increased further by increasing the total inlet pressure (hence affecting the gas density). Since the volume flow rate at an injection nozzle exit is invariant and the injection nozzle exit area is constant, this implies that the exit velocity is constant. However, one may redistribute the injection nozzles 94' in injection tube 90 in order to affect the mass flow distribution entering the chamber. Hence, the mass flow distribution may be designed to behave in either manner as described in FIGS. 10A and 10B. For example, if injection nozzles 94' are clustered towards the ends of injection tubes 90, then a mass flow distribution similar to FIG. 10B can be obtained. Conversely, if injection nozzles 94' are clustered towards the center of the injection tubes, then a mass flow distribution similar to FIG. 10A can be obtained. Additionally, far from the injection plane (approximately 10 to 20 injection nozzle diameters) the velocity distribution will behave similar to these distribution forms.

There are several advantages to the use of the gas injection tubes, namely: RF bias of the gas injection tubes allows periodic cleaning of the exterior surface; variable placement of adjacent tubes in separate vertical and/or horizontal planes, allowing each injection tube to be located at a different vertical height above the substrate for improved process control; selectable injection nozzle distribution for modification of inlet mass flow distribution; supersonic or subsonic injection capability; and adjustment of gas momentum in the injection tubes for mass flow redistribution subsonic injection.

As mentioned earlier herein with reference to FIGS. 1 and 2, a plasma source according to the invention includes a plurality of pumps 18 that continuously withdraw gas from region 10 during a processing operation. Each pump 18 acts primarily on an associated section of region 10. Processing at high rates requires high gas throughput to get the desired number of surface chemical reactions to occur. Processing needs high gas throughput and high plasma density. The large number of pumps employed in the embodiments disclosed herein provide the high pumping capacity needed to achieve high processing rates for large area substrates. Each pump is fitted with a throttle control valve, as shown at 22 in FIG. 1, that can regulate the pumping speed of that pump. By individually controlling the pumping speed of each pump 18, a wide variety of pumping speed profiles are possible. Each pump 18 may be constituted by any type of pump currently employed in plasma processing apparatus. Solely by way of non-limiting example, each pump 18 may be a turbomolecular pump, or turbo-pump, with or without a backing pump.

As indicated in FIGS. 1 and 2, apparatus according to the invention may be equipped with sixteen (4×4) pumps 18. Each pump may be a 1000 liter/sec turbo-pump positioned atop wall 12. Processing gas is directed towards the substrate from injection nozzles 94' in injection tubes 90 by the momentum created by the velocity at which the processing gas exits from the injection nozzles. After interacting with the substrate, unused process gas and volatile reaction products are removed via pumps 18. In order to minimize the interaction of reaction products with incoming process gas, an outward pressure gradient is established to bias the reaction products to flow to the outer walls and then upward to the pumps. This is accomplished by reducing the pumping rate of the pumps 18 that are proximate to the center of plate 12, for example by slightly closing the valves of the those pumps to decrease their pump conductance. In this manner lower chamber pressures can be achieved towards the walls of the chamber housing 2, 2'.

While the description above refers to particular embodiments of the present invention, it will be understood that many modifications may be made without departing from the spirit thereof. The accompanying claims are intended to cover such modifications as would fall within the true scope and spirit of the present invention.

A plasma source according to the invention may include a conventional chuck for holding the substrate, or wafer, to be processed. The chuck would be typical of most conventional plasma sources. In addition to holding the substrate, it should be capable of applying a RF bias to and heating the substrate. Therefore, for large area processing, this chuck could consist of multiple segments.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A chamber housing enclosing a plasma region in a large area plasma source used for performing plasma assisted processes on large area substrates, said chamber housing comprising:

a housing member constituting a substantially vertically extending wall surrounding a space corresponding to the plasma region, said housing member having a plurality of openings, and electrically conductive elements forming an electrostatic shield around the space;

a plurality of dielectric members each having a peripheral edge and each disposed to close a respective opening; and sealing means forming a hermetic seal between said housing member and said peripheral edge of each of said dielectric members.

2. The chamber housing according to claim 1 wherein said housing member has a plurality of recesses, each of said openings is formed in a respective recess, and said sealing means are disposed between said peripheral edge of each of said dielectric members and said recesses.

3. The chamber housing according to claim 2 wherein said wall has a polygonal form with a plurality of flat sides.

4. The chamber housing according to claim 3 wherein each of said sides has a single opening.

5. The chamber housing according to claim 4 wherein said electrically conductive elements are metal bars extending between, and secured to, upper and lower edges of said wall, each of said metal bars extending across a respective opening.

6. The chamber housing according to claim 5 further comprising elastic members interposed between said metal bars and said dielectric members.

7. The chamber housing according to claim 3 wherein each of said sides has a plurality of openings.

8. The chamber housing according to claim 7 wherein said electrically conductive elements are constituted by portions of said wall that extend between top and bottom edges of said wall and are interposed between said openings.

9. The chamber housing according to claim 8 wherein each of said dielectric members has a projecting portion that extends into said opening.

10. The chamber housing according to claim 3 wherein said flat sides extend vertically.

11. The chamber housing according to claim 3 wherein said wall has the form of a pyramidal frustum.

12. The chamber housing according to claim 2 wherein: said sealing means comprise, for each of said dielectric members, two annular seats disposed at an interface between said dielectric member and its associated recess, said seals being spaced apart along the interface; said wall has a passage having a first end in communication with the interface and a second end remote from the interface; and said housing further comprises pressure monitoring means connected to said second end of said passage to monitor leakage of fluid past either one of said seals.

13. A large area plasma source used for performing plasma assisted processes on large area substrates in a plasma region, said source comprising:

the chamber housing according to claim 1;

a coil surrounding said housing and operative for generating an RF field in the plasma region;

an enclosure member surrounding said housing and the plasma region;

gas injection means extending through said enclosure member for introducing an ionizable processing gas into the plasma region;

substrate support means for supporting a substrate to be processed in the plasma region; and a least one pump disposed for pumping gas out of the plasma region to maintain a low pressure in the plasma region.

14. The plasma source according to claim 13 wherein said gas injection means comprise at least one gas injection tube having at least one inlet portion for receiving a supply of the ionizable processing gas and an outlet portion provided with a plurality of injection nozzles via which the ionizable processing gas is conveyed from said inlet portion to the plasma region, wherein said outlet portion extends parallel to a substrate supported on said substrate support means.

15. The plasma source according to claim 14 wherein said at least one gas injection tube has two inlet portions and said outlet portion is interposed between said two inlet portions.

16. The plasma source according to claim 15 wherein said outlet portion of said at least one gas injection tube extends in a straight line between said two inlet portions.

17. The plasma source according to claim 16 wherein said at least one gas injection tube comprises a plurality of gas injection tubes spaced from one another in a plane parallel to a substrate supported on said substrate support means.

* * * * *